(12) United States Patent
Ban

(10) Patent No.: US 10,818,554 B2
(45) Date of Patent: Oct. 27, 2020

(54) LASER PROCESSING METHOD OF WAFER USING PLURAL LASER BEAMS

(71) Applicant: DISCO CORPORATION, Tokyo (JP)

(72) Inventor: Yuri Ban, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 0 days.

(21) Appl. No.: 15/944,493

(22) Filed: Apr. 3, 2018

(65) Prior Publication Data

US 2018/0294190 A1 Oct. 11, 2018

(30) Foreign Application Priority Data

Apr. 5, 2017 (JP) ................................ 2017-075405

(51) Int. Cl.

| | | |
|---|---|---|
| H01L 21/82 | (2006.01) | |
| B23K 26/00 | (2014.01) | |
| B23K 26/08 | (2014.01) | |
| B23K 26/359 | (2014.01) | |
| B23K 26/0622 | (2014.01) | |
| B23K 26/067 | (2006.01) | |
| B23K 26/364 | (2014.01) | |
| B23K 26/352 | (2014.01) | |
| H01L 21/673 | (2006.01) | |
| B23K 103/00 | (2006.01) | |

(Continued)

(52) U.S. Cl.
CPC .......... *H01L 21/82* (2013.01); *B23K 26/0006* (2013.01); *B23K 26/0622* (2015.10); *B23K 26/0676* (2013.01); *B23K 26/083* (2013.01); *B23K 26/352* (2015.10); *B23K 26/359* (2015.10); *B23K 26/364* (2015.10); *H01L 21/673* (2013.01); *B23K 2101/40* (2018.08); *B23K 2103/52* (2018.08); *B23K 2103/56* (2018.08); *H01L 21/67092* (2013.01)

(58) Field of Classification Search
CPC ..... H01L 21/78–21/82; H01L 21/3043; B23K 26/0676; B23K 26/0622; B23K 26/364; B23K 26/359; B23K 26/083; B23K 26/0006

See application file for complete search history.

(56) References Cited

U.S. PATENT DOCUMENTS

2014/0213043 A1* 7/2014 Van der Stam .... B23K 26/0006
                                                           438/463
2016/0315010 A1* 10/2016 Van Der Stam ........ H01L 21/78

FOREIGN PATENT DOCUMENTS

| JP | 2016196018 A | 11/2016 |
|---|---|---|
| JP | 2016203222 A | 12/2016 |

\* cited by examiner

*Primary Examiner* — Laura M Menz
*Assistant Examiner* — Candice Chan
(74) *Attorney, Agent, or Firm* — Greer Burns & Crain Ltd.

(57) ABSTRACT

A laser processing method for a wafer that is segmented by plural planned dividing lines set on a surface in a lattice manner uses a laser processing apparatus including a laser beam irradiation unit that irradiates, through a collecting lens, the wafer held by a chuck table, with plural laser beams formed by being oscillated by a laser beam oscillator and being split by a laser beam splitting unit. The method includes a processed groove forming step of irradiating the wafer with the plural laser beams along the planned dividing lines and forming a processed groove along the planned dividing lines. The plural laser beams split by the laser beam splitting unit are arranged in a line manner along a direction that is non-parallel to an extension direction of the planned dividing line irradiated with the plural laser beams.

9 Claims, 3 Drawing Sheets

(51) Int. Cl.
*H01L 21/67* (2006.01)
*B23K 101/40* (2006.01)

LASER PROCESSING METHOD OF WAFER USING PLURAL LASER BEAMS

BACKGROUND OF THE INVENTION

Field of the Invention

The present invention relates to a laser processing method of a wafer.

Description of the Related Art

Device chips such as integrated circuit (IC) chips are formed through dividing of a wafer that is composed of a semiconductor and has a circular disc shape along planned dividing lines set on a surface of this wafer in a lattice manner. The device is formed in each of regions on the surface of the wafer marked out by these planned dividing lines. Furthermore, in order to reduce parasitic capacitance between wiring layers used for these devices, a functional layer having a so-called Low-k material with a low dielectric constant is formed as an interlayer insulating film. For segmentation of this functional layer having the Low-k material and segmentation of the wafer, ablation processing by use of a laser beam is carried out. In the ablation processing, a wafer is partly heated and removed by irradiating a surface of the wafer with a pulse laser beam along a planned dividing line. This forms a processed groove having a predetermined depth in the wafer.

In the ablation processing, the processed groove formed in the wafer becomes deeper and larger when the power of the laser beam is raised. Furthermore, possibly damage is given to the device close to the planned dividing line if the power of the laser beam is excessively raised. Therefore, in order to prevent damage from being given to the device due to the irradiation with the laser beam, the processing-target place is scanned by the laser beam with allowable power plural times and the processed groove with a desired size is formed. For example, by splitting a laser beam for scanning into plural laser beams with allowable power, the processing-target place is irradiated with the plural split laser beams in succession to form a processed groove (for example, refer to Japanese Patent Laid-open No. 2016-196018 and Japanese Patent Laid-open No. 2016-203222). Conventionally, the original laser beam is split in such a manner that the plural laser beams arising from the splitting are lined up along an extension direction of the planned dividing line of the wafer.

SUMMARY OF THE INVENTION

When a wafer is irradiated with a laser beam and ablation processing is carried out, the wafer is evaporated due to heat and plasma is generated. Furthermore, a melted-and-solidified object called debris is generated. If the plasma and debris are generated due to irradiation with the laser beam that impinges on a certain processing-target place first among the series of plural split laser beams, a problem is caused that irradiation with the subsequent laser beams is hindered by the debris and so forth and desired processing is not carried out. For this reason, it is preferable that the generated debris and so forth be rapidly discharged from the formed processed groove. However, in some cases, the discharge of the debris and so forth generated due to the irradiation with the preceding laser beam is suppressed due to the irradiation with the subsequent laser beams, so that the debris is buried back in the processed groove and the processed groove becomes shallow. In particular, when scanning by the laser beam is carried out plural times to form a deep processed groove, the irradiation with the laser beams is hindered gradually greatly by the debris and so forth that increase as the number of times of scanning increases and the processing rate (amount of workpiece removed per one time of scanning by the laser beam) decreases.

Therefore, the present invention is made in view of such a problem and an object thereof is to provide a laser processing method of a wafer that can suppress a hindrance to irradiation with subsequent laser beams due to debris and so forth generated due to irradiation with a preceding laser beam in ablation processing in which irradiation with plural laser beams arising from splitting is carried out.

In accordance with an aspect of the present invention, there is provided a laser processing method of a wafer in which a wafer having a device in each of regions marked out by a plurality of planned dividing lines set on a surface in a lattice manner is processed by using a laser processing apparatus including a laser beam irradiation unit having a laser beam oscillator that oscillates a pulse laser beam with such a wavelength as to be absorbed by the wafer, a laser beam splitting unit, and a collecting lens and having a function of irradiating, through the collecting lens, the wafer held by a chuck table with a plurality of laser beams formed by being oscillated by the laser beam oscillator and being split by the laser beam splitting unit. The laser processing method includes a holding step of holding the wafer by the chuck table and a processed groove forming step of irradiating the wafer with the plurality of laser beams along the planned dividing line and forming a processed groove along the planned dividing line in the wafer. In the processed groove forming step, the plurality of laser beams split by the laser beam splitting unit are arranged in a line manner along a direction that is non-parallel to an extension direction of the planned dividing line irradiated with the plurality of laser beams.

Preferably, in the processed groove forming step, the wafer is irradiated with the plurality of laser beams along each of the plurality of planned dividing lines two or more times and the wafer is divided by the processed grooves.

In the laser processing method of a wafer according to the aspect of the present invention, the wafer is irradiated with the plural laser beams along the planned dividing line and the processed groove along the planned dividing line is formed in the wafer. At this time, the plural laser beams formed by being split by the laser beam splitting unit of the laser processing apparatus are arranged in a line manner along the direction that is non-parallel to the extension direction of this planned dividing line irradiated with these plural laser beams. In this case, debris and so forth generated through the irradiation with the preceding laser beam among these plural laser beams are irradiated with the subsequent laser beam less readily. For this reason, the irradiation with this subsequent laser beam is not blocked by this debris and so forth. In addition, discharge of this debris and so forth is also not suppressed by this subsequent laser beam. Moreover, the width of the processed groove becomes large compared with the spot diameter of the laser beams and therefore the discharge of the debris generated from the wafer is facilitated. For this reason, the processed groove becomes shallow due to burying-back of the debris and so forth less readily. Therefore, the processing rate also decreases less readily and ablation processing by the laser beams can be properly carried out.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

Figure 1:
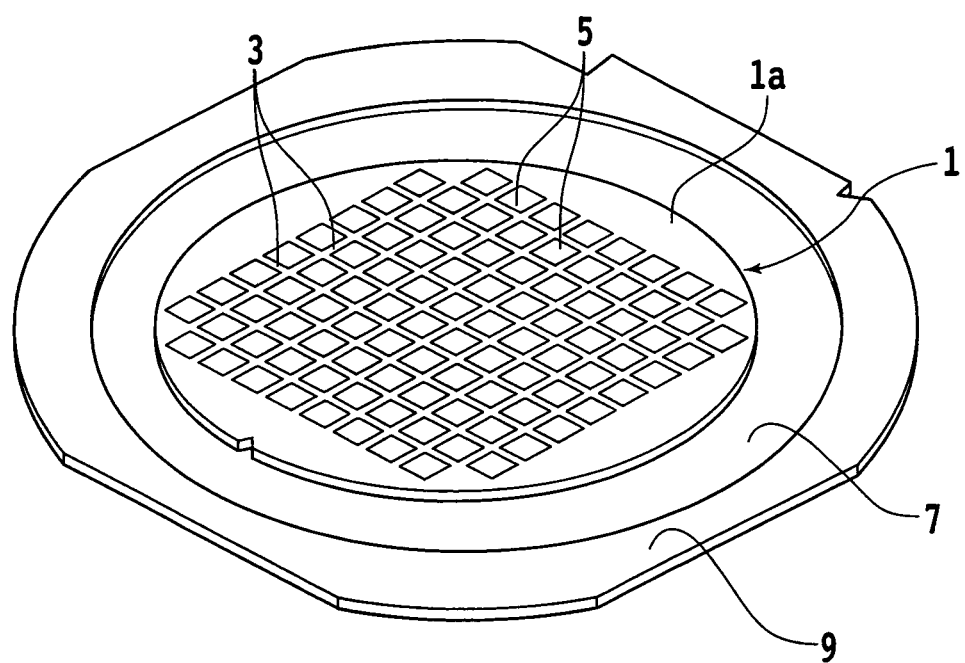
FIG. 1 is a perspective view schematically showing a wafer stuck to a tape stretched in a frame.

First, description will be made by using FIG. 1 about a wafer that is a workpiece in a laser processing method of a wafer according to the present embodiment. FIG. 1 is a perspective view schematically showing a wafer stuck to a tape stretched in a frame. This wafer 1 is a substrate composed of a material such as silicon, silicon carbide (SiC), or another semiconductor or a material such as sapphire, glass, or quartz for example. The wafer 1 may be a molded resin substrate obtained through sealing of a substrate on which devices have been formed by a resin or may be a layer-stacked substrate of semiconductor wafer and resin for example. A front surface 1a of the wafer 1 is segmented into plural regions by plural planned dividing lines (streets) 3 arranged in a lattice manner and devices 5 such as ICs are formed in the respective regions obtained by the segmentation by these plural planned dividing lines 3. Finally, the wafer 1 is divided along the planned dividing lines 3 and thereby the individual device chips are formed.

A tape 7 stretched in a frame 9 made of a metal is stuck to the back surface of this wafer 1. The wafer 1 is handled through the frame 9 while the laser processing method of a wafer according to the present embodiment is carried out. This makes the handling of the wafer 1 easy. The tape 7 has a film-shaped base having flexibility and a glue layer (adhesive layer) formed on one surface of this base. For example, polyolefin (PO) is used for the base. Polyethylene terephthalate (PET) having higher rigidity than PO, polyvinyl chloride, polystyrene, or the like may be used. Furthermore, for the glue layer (adhesive layer), silicone rubber, acrylic-based material, epoxy-based material, or the like is used for example.

Figure 2:
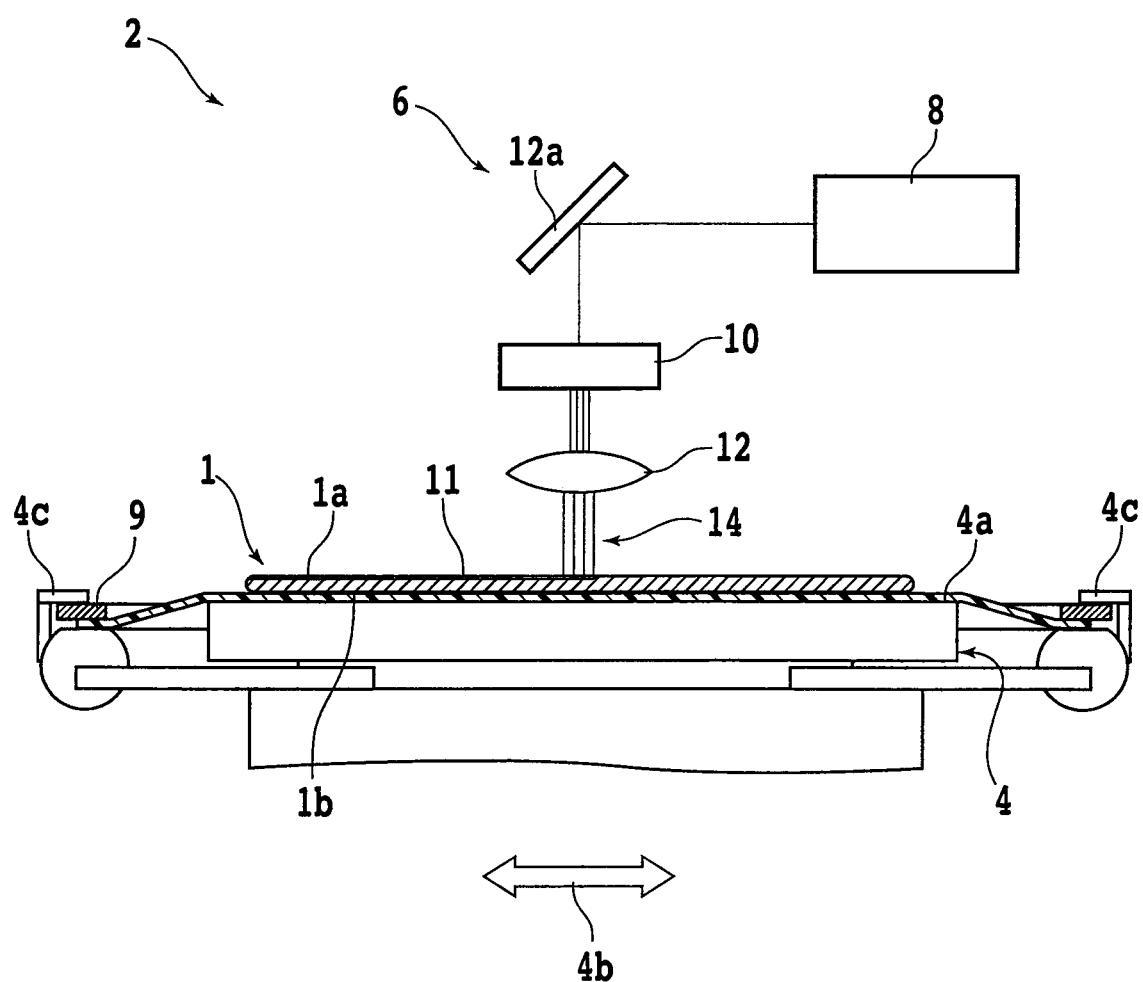
FIG. 2 is a partial sectional view for schematically explaining a processed groove forming step.

Next, a laser processing apparatus 2 used in the laser processing method of a wafer according to the present embodiment will be described by using FIG. 2. This laser processing apparatus 2 includes a chuck table 4 that holds the wafer 1 by suction and a laser beam irradiation unit 6 disposed over this chuck table 4. The chuck table 4 has a porous member (not shown) on the upper surface side. The upper surface of this porous member serves as a holding surface 4a that holds the wafer 1 on the chuck table 4. The chuck table 4 has a suction source (not shown) connected to this porous member. When the wafer 1 is put on this holding surface 4a and a negative pressure generated by this suction source is caused to act on this wafer 1 through pores of this porous member, the wafer 1 is held by the chuck table 4 by suction. Furthermore, clamps 4c that fix the frame 9 are provided around the chuck table 4.

The laser processing apparatus 2 includes processing feed means (processing feed mechanism, not shown) that employs a pulse motor or the like as power. This processing feed means can move the chuck table 4 in a processing feed direction 4b of the laser processing apparatus 2. At the time of processing of the wafer 1 or the like, feeding of the chuck table 4 is carried out in the processing feed direction 4b and thereby processing feed of the wafer 1 is carried out. Furthermore, the chuck table 4 can rotate around an axis substantially perpendicular to the holding surface 4a and the processing feed direction of the wafer 1 can be changed when the chuck table 4 is rotated. Moreover, the laser processing apparatus 2 includes indexing feed means (indexing feed mechanism, not shown) that employs a pulse motor or the like as power. This indexing feed means can move the chuck table 4 in the indexing feed direction (not shown) of the laser processing apparatus 2 orthogonal to the processing feed direction.

The laser beam irradiation unit 6 includes a laser beam oscillator 8 that oscillates a laser beam, a laser beam splitting unit 10, and a collecting lens 12. The laser beam irradiation unit 6 may further have optical parts such as a reflective mirror 12a. The laser beam oscillator 8 has a function of oscillating a pulse laser beam with such a wavelength as to be absorbed by the wafer 1 (for example, 355 nm). The laser beam splitting unit 10 is a diffractive optical element (DOE) for example. The DOE has a function of splitting an incident laser beam into plural laser beams by using a diffraction phenomenon. The collecting lens 12 has a function of collecting an incident laser beam to a position separate by a specific distance unique to this collecting lens 12.

According to this laser beam irradiation unit 6, the laser beam oscillated by the laser beam oscillator 8 is made incident on the laser beam splitting unit 10 and is split, and the split laser beams pass through the collecting lens 12 and the front surface 1a of the wafer 1 held on the chuck table 4 is irradiated with the laser beams. In the present embodiment, the respective parts of the laser beam irradiation unit 6 are set in such a manner that the spots irradiated with the respective laser beams (light focus points) are lined up at equal intervals in a straight line manner on the front surface 1a of the wafer 1 when the front surface 1a of the wafer 1 is irradiated with the plural laser beams arising from the splitting. Moreover, in this laser processing apparatus 2, the optical system of the laser beam irradiation unit 6 is set in such a manner that the plural laser beams arising from the splitting are lined up along a direction that is non-parallel to the processing feed direction of the chuck table 4. That is, the laser beam irradiation unit 6 can carry out irradiation with plural laser beams split in such a manner as to be shifted from each other in the direction perpendicular to the planned dividing line 3 of the wafer 1 held on the chuck table 4.

Each step of the laser processing method of a wafer according to the present embodiment will be described below. First, a holding step will be described by using FIG. 2. In the holding step, the wafer 1 is put on the holding surface 4a of the chuck table 4 in the state in which the side of a back surface 1b of the wafer 1 is oriented toward the chuck table 4 and the side of the front surface 1a is oriented upward. Then, when a negative pressure generated by the suction source is caused to act on this wafer 1 through the pores of the porous member of the chuck table 4, the wafer 1 is held by the chuck table 4 by suction. The tape 7 is stuck to the back surface 1a of the wafer 1 in advance. Thus, the wafer 1 is held by the chuck table 4 with the intermediary of this tape 7 (see FIG. 1).

In the processing method of a wafer according to the present embodiment, subsequently a processed groove forming step of lining up plural laser beams and irradiating the wafer 1 with the laser beams along the planned dividing lines 3 to form processed grooves along these planned dividing lines 3 in this wafer 1 is carried out. FIG. 2 is a partial sectional view for schematically explaining the processed groove forming step. First, the relative position of the chuck table 4 and the laser beam irradiation unit 6 is adjusted so that a processed groove 11 can be formed on the front surface 1a of the wafer 1 along the planned dividing line 3 from one end to the other end of this planned dividing line 3. Next, the chuck table 4 is moved while irradiation with plural laser beams from the laser beam irradiation unit 6 is carried out. Then, when processing feed of the wafer 1 is carried out while these plural laser beams are focused on the front surface 1a of the wafer 1, the processed groove 11 is formed on the wafer 1.

Figure 3A:
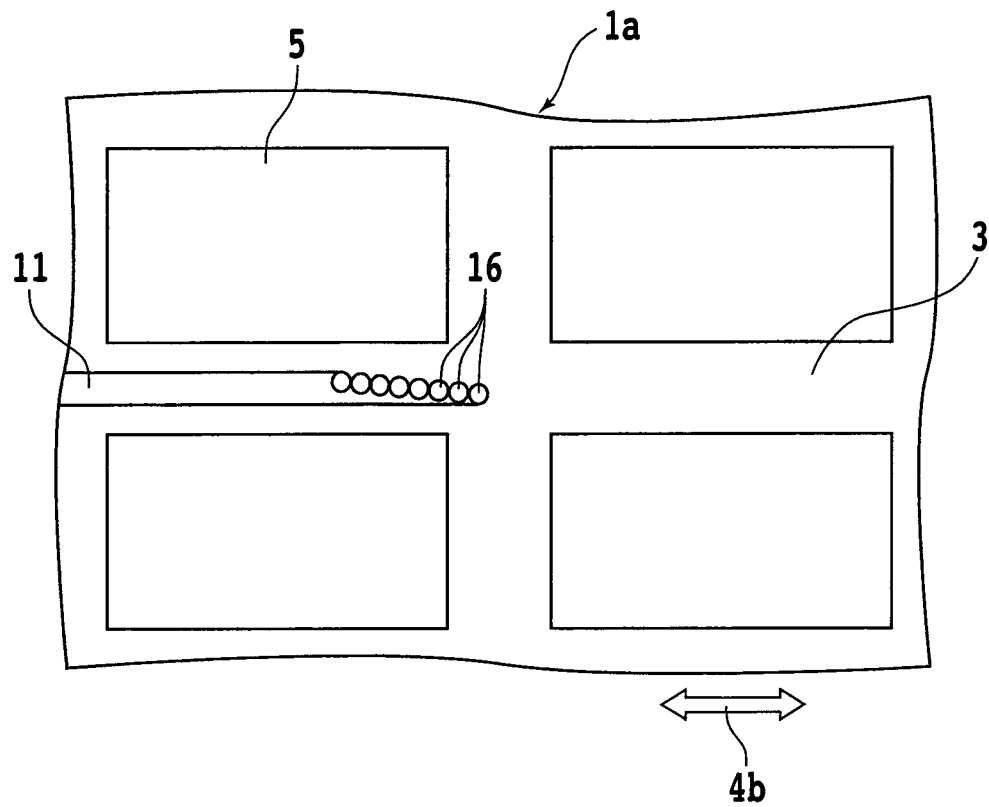
FIG. 3A is a top view schematically showing the relationship between the respective spots of plural laser beams arising from splitting with which the wafer is irradiated and a planned dividing line.

Explanation will be made by using FIG. 3A about the relationship between the respective spots at which the respective laser beams of the plural laser beams arising from the splitting are focused on the front surface 1a of the wafer 1 and the planned dividing line 3 in the processed groove forming step. FIG. 3A is a top view schematically showing the front surface 1a of the wafer 1 in an enlarged manner. As shown in FIG. 3A, these plural laser beams arising from the splitting are lined up along a direction that is non-parallel to the extension direction of this planned dividing line 3. In this case, the respective relevant spots 16 are shifted from each other with respect to the direction perpendicular to the processing feed direction 4b of the wafer 1. At each spot 16 on which the pulse laser beam is focused, the wafer 1 is partly heated and removed due to the irradiation with the pulse laser beam. At this time, plasma is generated and a melted-and-solidified object called debris is generated.

For example, explanation will be made about the case in which, differently from the laser processing method of a wafer according to the present embodiment, plural laser beams arising from splitting are lined up along the direction parallel to the extension direction of the planned dividing line 3 and the respective spots are not shifted in the direction perpendicular to the processing feed direction 4b of the wafer 1. In this case, when a pulse laser beam is oscillated from the laser beam irradiation unit 6 and a certain processing point is irradiated with the preceding laser beam and then processing feed of the wafer 1 is carried out and the pulse laser beam is oscillated again, the vicinity of this processing point is irradiated with the subsequent laser beam again. In this case, the irradiation with the subsequent laser beam is hindered by plasma and debris generated due to the irradiation with the preceding laser beam and thus processing by the irradiation with the subsequent laser beam is not carried out as expected. Furthermore, in some cases, discharge of the generated debris is suppressed due to the irradiation with the subsequent laser beam, so that the debris is buried back in the processed groove and the processed groove becomes shallow. For this reason, the irradiation with the laser beam is hindered more greatly by the debris and so forth that increase as the number of times of scanning increases and the processing rate (amount of workpiece removed per one time of scanning by the laser beam) decreases.

In contrast, in the laser processing method of a wafer according to the present embodiment, plural laser beams arising from splitting are lined up along a direction that is non-parallel to the extension direction of the planned dividing line 3 and the respective relevant spots 16 are lined up along a direction that is non-parallel to the processing feed direction 4b of the wafer 1. When a certain processing point is irradiated with the preceding laser beam and then processing feed of the wafer 1 is carried out and the pulse laser beam is oscillated from the laser beam irradiation unit 6 again, a position shifted from this processing point in the direction perpendicular to the processing feed direction 4b is irradiated with the subsequent laser beam. In this case, the position shifted from plasma and debris generated due to the irradiation with the preceding laser beam is irradiated with the subsequent laser beam. Thus, this subsequent laser beam is less susceptible to the influence of this debris and so forth. Furthermore, discharge of this debris and so forth is suppressed due to this laser beam less readily. Moreover, the width of the formed processed groove 11 in the direction perpendicular to the processing feed direction 4b becomes large compared with the relevant spot diameter and therefore the discharge of the debris is promoted.

For this reason, the burying-back of the generated debris and so forth in the processed groove 11 is suppressed, and the processing rate of the laser processing is kept even in the case of carrying out scanning with plural laser beams 14 arising from splitting along the planned dividing line 3 plural times. When the respective spots 16 are lined up in parallel to the processing feed direction 4b, the processing rate decreases more readily as the processed groove 11 becomes deeper. Therefore, the effect of keeping of the processing rate in the laser processing method of a wafer according to the present embodiment becomes more significant as the processed groove 11 becomes deeper.

Figure 3B:
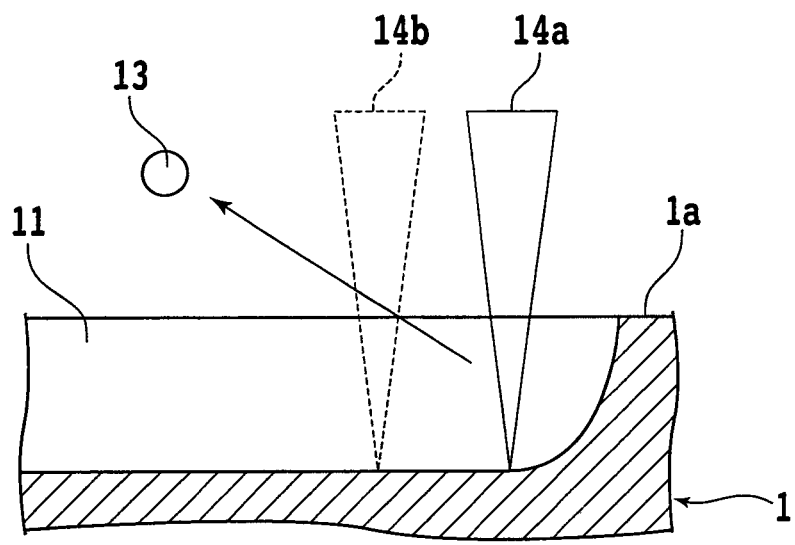
FIG. 3B is a sectional view for schematically explaining a processed groove forming step.

FIG. 3B is a sectional schematic diagram showing the vicinity of the spots 16 on the wafer 1 in the processed groove forming step in an enlarged manner. The sectional schematic diagram shown in FIG. 3B is a sectional schematic diagram showing a cut plane along the processing feed direction 4b and only two laser beams among the plural laser beams 14 arising from splitting are shown for convenience of explanation. Irradiation with a preceding laser beam 14a and a subsequent laser beam 14b is carried out in such a manner that these beams are shifted from each other in the direction perpendicular to the processing feed direction 4b. In this case, processing dust 13 such as debris generated through the irradiation with the preceding laser beam 14a is not irradiated with the subsequent laser beam 14b with which irradiation is carried out next after processing feed of the wafer 1. Thus, irradiation of the wafer 1 with the subsequent laser beam 14b is carried out as expected without being blocked by the processing dust 13. Simultaneously with this, discharge of the processing dust 13 is not hindered by this subsequent laser beam 14b. After the irradiation with the laser beams 14 is carried out along one planned dividing line 3 of the wafer 1 and the processed groove 11 is formed in the above-described manner, indexing feed of the wafer 1 is carried out and the processed groove 11 is formed along the adjacent planned dividing line 3. After the processed groove 11 is formed along all planned dividing lines 3 along one direction, the chuck table 4 is rotated to change the processing feed direction and the processed grooves 11 are formed along all planned dividing lines 3.

When a laser beam oscillated in the laser beam oscillator 8 is split by the laser beam splitting unit 10 and the split laser beams 14 are formed in the laser beam irradiation unit 6, the laser beam is split into eight laser beams for example. In this case, irradiation of the front surface 1a of the wafer 1 with the eight split laser beams 14 is carried out and the eight split laser beams 14 are focused on eight spots. At this time, the eight spots are lined up at substantially equal intervals in a straight line manner. When the direction along which the split laser beams 14 are lined up is set to an orientation that is non-parallel to the planned dividing line 3, possibly part of the split laser beams 14 goes beyond the width of the planned dividing line 3 and the device 5 formed on the wafer 1 is irradiated with this laser beam 14, so that the device 5 is broken. For this reason, the direction along which the split laser beams 14 are lined up is adjusted in such a manner that the device 5 is irradiated with neither the first nor last laser beam 14 among the split laser beams 14 lined up in the straight line manner.

Moreover, when the eight split laser beams 14 are generated by the laser beam splitting unit 10, a laser beam with weak power called ghost is further generated collaterally with these eight split laser beams. Even this laser beam called ghost often gives damage to the device 5 when the device 5 formed on the wafer 1 is irradiated with this ghost. Therefore, the direction along which the split laser beams 14 are lined up is adjusted in such a manner that the device 5 is also prevented from being irradiated with this ghost as much as possible. For example, when the processed groove 11 is formed along the planned dividing line 3 whose width is at least 20 µm and at most 30 µm, it is preferable to shift the centers of spots adjacent to each other in the direction perpendicular to the processing feed direction 4b by distance in a range of 0.5 to 1 µm regarding the eight spots lined up at substantially equal intervals. Furthermore, for example, it is preferable to shift the center of the first spot among the eight spots lined up at equal intervals and the center of the eighth spot in the direction perpendicular to the processing feed direction 4b by distance in a range of 3 to 7 µm, and it is more preferable to shift them by distance in a range of 5 to 6 µm.

When irradiation with the plural split laser beams 14 is repeatedly carried out two or more times along one planned dividing line 3, the processed groove 11 with a larger depth is formed. When the depth of the formed processed grooves 11 reaches the thickness of the wafer 1, the wafer 1 is divided along the planned dividing lines 3 and the individual device chips are formed.

The present invention is not limited to the description of the above-described embodiment and can be carried out with various changes. For example, in the above-described embodiment, in the case of dividing the wafer 1 along one planned dividing line 3, irradiation with the plural split laser beams 14 is repeatedly carried out two or more times so that the depth of the processed groove 11 may reach the thickness of the wafer 1. However, one aspect of the present invention is not limited thereto. For example, the wafer 1 may be divided by applying an external force to the wafer 1 in which the processed groove 11 has been formed and forming a crack that extends from the bottom part of this processed groove 11 to the back surface 1b of the wafer 1.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A laser processing method of a wafer in which a wafer having a device in each of regions marked out by a plurality of planned dividing lines set on a surface in a lattice manner is processed by using a laser processing apparatus including a laser beam irradiation unit having a laser beam oscillator that oscillates a pulse laser beam with such a wavelength as to be absorbed by the wafer, a laser beam splitting unit, and a collecting lens and having a function of irradiating, through the collecting lens, the wafer held by a chuck table with a plurality of laser beams formed by being oscillated by the laser beam oscillator and being split by the laser beam splitting unit, the laser processing method comprising:
 a holding step of holding the wafer by the chuck table; and
 a processed groove forming step of simultaneously irradiating the wafer with the plurality of laser beams along the planned dividing line and forming a processed groove along the planned dividing line in the wafer,
 wherein, in the processed groove forming step, the plurality of laser beams split by the laser beam splitting unit are arranged in a single line along a direction that is non-parallel to an extension direction of the planned dividing line irradiated with the plurality of laser beams, and wherein at least two of said plurality of laser beams are shifted from each other on the wafer.

2. The laser processing method of a wafer according to claim 1, wherein in the processed groove forming step, the wafer is irradiated with the plurality of laser beams along each of the plurality of planned dividing lines two or more times and the wafer is divided by the processed grooves.

3. The laser processing method of a wafer according to claim 1, wherein at least two of said plurality of laser beams are shifted in a direction perpendicular to a processing feed direction of the wafer.

4. The laser processing method of a wafer according to claim 1, wherein said at least two of said plurality of laser beams are shifted by a distance in a range of 0.5 µm to 1 µm.

5. The laser processing method of a wafer according to claim 1, wherein the processed groove forming step includes adjusting a position of said plurality of laser beams so that the devices in the regions are not irradiated with a first laser beam or a last laser beam of said plurality of laser beams.

6. The laser processing method of a wafer according to claim 5, wherein said first laser beam and said last laser beam are shifted by a distance in a range of 5.0 µm to 6.0 µm from an adjacent laser beam of said plurality of laser beams.

7. The laser processing method of a wafer according to claim 5, wherein said first laser beam and said last laser beam are shifted by a distance in a range of 3.0 µm to 7.0 µm from an adjacent laser beam of said plurality of laser beams.

8. The laser processing method of a wafer according to claim 1, wherein said at least two of said plurality of laser beams are shifted from each other when viewed from an upper surface of the wafer.

9. The laser processing method of a wafer according to claim 1, further comprising generating another laser beam having a power that is less than a power of the plurality of laser beams.

* * * * *